&

US006144199A

United States Patent [19]
Sharf et al.

[11] Patent Number: 6,144,199
[45] Date of Patent: Nov. 7, 2000

[54] METHOD FOR IMAGING VESSEL WALL ANATOMY AND STRAIN

[75] Inventors: Yehuda Sharf, Tel Aviv; Gil Navon; Uzi Eliav, both of Ramat Gan; Liat Tsoref, Tel Aviv, all of Israel

[73] Assignee: Ramot University Authority for Applied Research and Industrial Development Ltd., Tel Aviv, Israel

[21] Appl. No.: 08/912,783

[22] Filed: Aug. 18, 1997

[51] Int. Cl.[7] ....................................................... G01V 3/00
[52] U.S. Cl. ............................................. 324/306; 324/300
[58] Field of Search .................................... 324/300, 306, 324/307, 309, 312, 314

[56] References Cited

U.S. PATENT DOCUMENTS

| 4,680,546 | 7/1987 | Dumoulin | 324/307 |
| 5,818,230 | 10/1998 | Katz et al. | 324/309 |

OTHER PUBLICATIONS

Klinkenberg et al, "$^2$H–NMR Imaging of Stress in Strained Elastomers", *Macromolecules*, 30: 1038–1043, 1997.

Sharf et al, "Detection of Anisotropy in Cartilage using $^2$H Double–Quantum–Filtered NMR Spectroscopy", *J. Magnetic Resonance*, Series B 107:60–67 (1995).

Sharf et al, "Measurement of Strain Exerted on Blood Vessel Walls by Double–Quantum–Filtered $^2$H NMR", *Magnetic Resonance in Medicine*, 37:69–75 (1997).

Sharf et al. "The Source of the Motional Anistropy of Water in Blood Vessels—$^2$H DQF NMR Study", presented to Soc. Magnetic Resonance in Medicine, Nice, France, 1995.

Sharf et al, "The Effect of Blood Vessels Stretching on $^2$H DQF NMR Lineshapes", presented to Soc. Magnetic Resonance in Medicine, Nice, France, 1995.

Shinar et al "Discrimination Between the Different Compartments in Sciatic Nerve by $^2$H Double–Quantum–Filtered NMR", presented to Soc. Magnetic Resonance in Medicine, N.Y., 1996.

Sharf et al, "Measurements of Strain Exerted on the Blood Vessel Wall by $^2$H Double–Quantum–Filtered NMR", *Magn. Reson. Med.*, 37:69–75 1997.

Sharf et al, "Measurement of the Tensile Force Exerted on Blood Vessels Using $^2$H Double Quantum NMR Spectroscopy", Ann. Mtg., Veldhoven, Netherlands, 1994.

Knubovets et al, "Measurements of Local Order in Connective Tissues by Multiple Quantum Filtered NMR of Quasupolar Nuclei", Ann Mtg., Veldhoven, Netherlands, 1994.

Navon et al, "by Multiple Quantum Filtered NMR of Quasupolar Nuclei as a New Tool for Imaging and Diffusion Measurements in Biological Systems", Abstract, Magn. Reson. Biol. Syst., Ketston, CO, 1996.

Ackerman,J., "Intra–and Extracellular Compartmental Resolution by NMR: Ions in Complex Living Systems", Abstract, Magn. Reson. Biol. Syst., Ketston, CO, 1996.

Lusse et al, "Adsorption of Water Molecules in Bovine Nasal and Articular Cartilage Studied by Using $^2$H Double Quantum NMR Spectroscopy", Abstract, Magn. Reson. Biol. Syst., Ketston, CO, 1996.

Sharf et al, "$^2$H Double–Quantum–Filtered NMR—A Novel Tool for Structural Studies", Abstract, Magn. Reson. Biol. Syst., Ketston, CO, 1996.

Sharf et al, "The Source of NMR–Detected Motional Anisotropy of Water in Blood Vessel Walls", *Biophysical J.*, 73: 1–7, 1997.

*Primary Examiner*—Louis Arana
*Attorney, Agent, or Firm*—Mark M. Friedman

[57] ABSTRACT

A method for depicting the anatomy and quantitative tissue strain of a biological tissue. A spatially resolved, double quantum filtered, nuclear magnetic resonance frequency spectrum is acquired from either $^1$H or $^2$H nuclei in the tissue. Values in the time domain or frequency domain representations of the free induction decay signal are mapped in 2 spatial dimensions so as to selectively depict histological layers of the tissue anatomy. The residual quadrupolar or dipolar splitting is calculated from the free induction decay signal, and then correlated with a tissue strain value by utilizing a known formula describing the correlation between residual quadrupolar or dipolar splitting and tissue strain. The tissue strain value is then mapped in two spatial dimensions.

14 Claims, 5 Drawing Sheets

(2 of 5 Drawing Sheet(s) Filed in Color)

(a) Gradient echo (b) DQF ($\tau$=0.3 ms, $\Delta\nu$=0 Hz)

(c) DQF - Inner layer
($\tau$=2.0 ms, $\Delta\nu$=0 Hz)

(d) DQF - Outer layer
($\tau$=0.3 ms, $\Delta\nu$=300 Hz)

METHOD FOR IMAGING VESSEL WALL ANATOMY AND STRAIN

FIELD AND BACKGROUND OF THE INVENTION

The present invention relates to the process of imaging the anatomy and physiological properties of a tissue, and in particular, it concerns a method for imaging the histological layers of a blood vessel wall and mapping the tissue strain in those layers.

It is known that cardiovascular disease is the single most important cause of mortality in first world populations today, primarily due to disease processes causing narrowing and/or disruption of the vessel wall of the coronary and other major arteries. Investigation of the mechanical properties and structure of human blood vessel walls is thus an important field of laboratory and clinical research.

Blood vessel walls consist of three histological tissue layers, any of which may be involved in a pathological process: the outer layer, the tunica adventitia, the intermediate layer, the tunica media and the inner layer—the tunica intima. Each of these layers posses a unique biochemical and mechanical structure, alterations in which may be associated not only with pathological processes, but with normal physiological variants as well. In addition, it is known that at normal blood pressure the length of a vessel is as much as 40% longer, and its circumference up to 30% greater, than that in the unstressed condition. The layers of a blood vessel wall are thus exposed to significant stress and strain in normal physiological conditions, and alterations in vessel wall strain may conceivably be an important cause of, or consequence, of, vessel wall pathology. The standard imaging modalities for investigating blood vessels (contrast angiography and magnetic resonance angiography), however, do not image the blood vessel wall itself, but rather the contents of the vessel lumen: the blood. Other cardiovascular imaging techniques such as conventional ultrasound and standard T1 or T2 weighted magnetic resonance imaging (MRI) do not have sufficient resolution to adequately image the tissues constituting the vessel wall, as human blood vessel walls are very thin (approximately 2 millimeters thick). Most importantly, all the above mentioned cardiovascular imaging techniques suffer from two major deficiencies: firstly, the vessel wall can only be imaged (if at all) in its entirety, as a single unit, making accurate differentiation between the three tissue layers difficult; and secondly, no information describing the biochemical and mechanical properties of the vessel wall (such as the tissue strain in each histological layer) is provided.

There is thus a need for an imaging method capable of accurately depicting the tissue layers constituting a blood vessel wall, and quantifying their biochemical and mechanical characteristics. The present invention is a method for displaying the distinct tissue layers of a blood vessel wall and quantifying their mechanical strain, based on a new technique of magnetic resonance imaging: $^1H$ or $^2H$ double quantum filtered MRI.

The basic principles underlying the process of magnetic resonance spectroscopy and imaging will be well known to one familiar with the art. In brief, nuclei possessing an odd number of protons (such as hydrogen $^1H$) possess a magnetic moment, and behave in a predictable manner when exposed to a strong external magnetic field (Bn). Such nuclei will align themselves relative to the external magnetic field and rotate on their axes, or precess, in a manner which is dependent on the individual nuclei chemical and physical surrounding and the orientation of the applied external and magnetic field. Then, if exposed to a pulse of radio frequency (RF) energy of appropriate frequency, timing and duration, the nuclei will absorb such energy by changing he orientation of their magnetic moments relative to each other and the external magnetic field, leading to a change in the nature of their precession. The energy absorption (or emission) is the well known phenomenon of magnetic resonance. When the RF pulse is discontinued, the nuclei emit a detectable radio frequency signal (as the nuclei "relax" back to their prior energy state by non-radiative processes) typical of the specific nuclei and its specific chemical and physical surrounding. The emitted signal, known as the "free induction decay" (FID), depicts a change of magnetization over time, and can also be described in terms of a superposition of many RF frequency. These time characteristics and RF characteristics of the FID can be analyzed so as to obtain information about the properties of the nuclei being studied. The transition from the time domain (the FID) to the frequency domain (the RF spectrum), and vice-versa, is achieved by performing a fast Fourier transform and its inverse. Thus, any calculation performed in the frequency domain will have an analogous calculation in the time domain, and vice-versa.

The technique of magnetic resonance spectroscopy described above furnishes magnetic resonance data about the microscopic environment Spectroscopy in most of its application does not involve spatial localization. Thus it provides information about the physics and chemistry of the constituents of a tissue, but does not present an image. However, by exposing the tissue being studied to appropriately timed magnetic gradients of varying intensity along the spatial axes, known as "phase encoding gradients", the spatial location of the nuclei giving rise to the FID can be localized in three dimensions, thus allowing for two or three dimensional mapping, or imaging, of the tissue based on the MR signal, i.e. a process of magnetic resonance imaging (MRI).

Standard MRI techniques (such as gradient echo imaging and spin echo imaging) are based on measuring the FID emitted by hydrogen nuclei $^1$), which are simple magnet dipoles possessing a spin of ½. In the presence of an external magnetic field ($B_0$) such dipoles can be described as being in one of two energy states (described by the magnetic quantum numbers −½, or +½), and when excited by an appropriate RF pulse, the nuclei undergo "single quantum" transitions between these two states. These single quantum transition are responsible for the creation of a detectable FID.

More complex nuclei, such as deuterium ($^2H$), are quadrupolar. Such nuclei have a spin >½, may be described as being in one of multiple possible energy states. In the case of deuterium, the possible energy states are described by the magnetic quantum numbers −1,0 and +1.If transitions occur between energy states −1 and +1, as facilitated by an appropriate RF pulse, the nuclei are said to have undergone "double quantum" transitions.

When quadrupolar nuclei are located in a disordered environment, such as a liquid, the rapid molecular reorientations of the nuclei are "isotropic", meaning that the reorientations of each molecule are such that overall directional information averages to zero. As such, the occurrence of double quantum transitions is not detectable. However, when quadrupolar nuclei are bound to an ordered protein structure, such as the collagen fibres of a blood vessel wall, the rapid movements of the quadrupolar nuclei demonstrate a directional tendency. Such movement is thus "anisotropic", and in terms of the electrical interaction between a quadrupolar nucleus and its electrical environment, results in the formation of a "non-vanishing residual quadrupolar interaction", which facilitates the detection of a double quantum transitions.

The occurrence of a double quantum energy transition is associated with the formation of a "double quantum coherence" state. Although such double quantum coherences cannot be directly observed by nuclear magnetic resonance techniques, the application of additional appropriate RF pulses to the tissue can transform the double quantum coherences into a detectable signal quantum coherence. The prior existence of a double quantum coherence in the tissue being studied can be revealed by specific characteristics of the resultant FID: a first order effect of residual quadrupolar splitting (i.e. the presence of peaks of two frequencies), and, in a second order approximation, an increased rate of relaxation due to rapidly fluctuating electric field gradients, caused by the molecular motion of the quadrupolar nuclei. The detection of residual quadrupolar splitting in an FID is thus indicative of the presence of anisotropy, and thus order, within the tissue being studied. Furthermore the degree of residual quadrupolar splitting is proportional to the degree of order within the tissue. Similarly, measurement of the second moment of the distribution of quadrupolar splitting of the FID may allow for an evaluation of the degree of order in the tissue.

When exposed to deuterated water ($D_2O$), the hydrogen ($^1H$) nuclei in the water of a biological tissue are replaced by deuterium ($^2H$) resulting in deuterated water becoming bound with the protein skeleton (mainly the collagen fibres) of the tissue. Due to the order in the protein skeleton, the bound deuterated water exhibits the properties of anisotropy described above. As such, deuterium can serve as a "spy" molecule allowing for the invention of the degree of anisotropy of a tissue.

When deuterated water is abundantly present in close proximity to an ordered tissue being imaged, as it usually the case with biological tissues, the magnetic resonance signal originating from the liquid masks the signal indicative of a non-vanishing residual quadrupolar interaction. In such circumstances filtering of the magnetic resonance signal is necessary for selective interrogation of the anisotropic tissue, such that only those FID signals which initially originated from double quantum coherences are preserved. Thus, by filtering out FID signals not originating from double quantum coherences, the renaming FID frequency and time domain data provide information regarding the degree of anisotropy, i.e. order, in the tissue to which the quadrupolar nuclei are bound. This is the basic principle underlying double quantum filtered (DQF) magnetic resonance spectroscopy.

It is known that as a tissue is stressed (for example, by being stretched) the strain within the tissue increases. It has also been shown that with increasing strain, the degree of order within the protein skeleton of the tissue increases. As shown above, the degree of order (anisotropy) can be quantified from the degree of quadrupolar splitting in a DQF MR signal. If the correlation between the degree of quadrupolar splitting and the degree of tissue strain for a given tissue is known, therefore, DQF MR spectral data can be used to quantiate the degree of tissue strain (Y. Sharf, S. Akselrod, G. Navon, "Measurement of strain exerted on blood vessel walls by double-quantum-filtered $^2H$ NMR," *Magnetic Resonance in Medicine*. 1997;37:69–75). $^2H$ DQF MR spectroscopy of this nature has been performed on blood vessels and other biological tissues (Y. Sharf, U. Eliav, H. Shinar, G. Navon, "Detection of anisotropy in cartilage using $^2H$ double-quantum-filtered NMR spectroscopy," *Journal of Magnetic Resonance*. 1994;B107:60–67). However, as spectroscopy alone does not furnish spatial information, this technique does not allow for two dimensional mapping of vessel wall anatomy or vessel wall strain.

A method for two dimensional mapping of strain in elastomer bands made of rubber, utilizing an $^2H$ DQF MRI technique, has been previously reported (M. Klinkenberg, P. Blumler, B. Blumich, "$^3H$ NMR imaging of stress in strained elastomers," *Macromolecules* 1997;30:1038–1043). Several factors, however, make this technique for imaging non-biologic materials unsuitable for use in biological tissues:

1. The technique used single quantum MR sequences (spin echo sequences) for calibration of the $^2H$ DQF MRI data. This is ineffective as a means of calibrating $^2H$ DQF MRI quadrupolar splitting data to tissue strain data, for the purpose of generating a tissue strain map, as single quantum techniques do not suppress the abundant MR signal generated by isotropic free water (or deuterated water) in biologic tissues. Investigation of anisotropic biologic tissues is thus not possible using this single quantum based technique.

2. The technique generated a single frequency value for each voxel, not a full FID spectral signal as is necessary for a quantitative evaluation of anisotropy. As such, the $^2DQF$ MRI strain maps generated by this technique were qualitative, and not quantitative, in nature. In addition, the residual quadrupolar splitting cannot be directly measured in the absence of a full FID spectrum. The technique therefore required acquiring multiple sets of images using the same imaging sequence with a different creation time ($\tau$) value, and then fitting the resultant data to a theoretical model so as to obtain a value for quadrupolar splitting. This process of fitting the data to a theoretical model introduces a degree of inaccuracy not present when the quadrupolar splitting is acquired directly from the $^2H$ DQF FID signal.

3. In order to couple deuterium to the network chains of interest in the rubber, deuterated poly(butadiene) oligomers were used. As this compound is hydrophobic, it is not suitable for use in biological tissues. Furthermore, as the interaction of oligomers with rubber is not analogous to that of deuterated water with biologic tissues, performance of $^2H$ DQF MRI strain mapping on rubber does not imply that the same technique of $^2H$ DQF MRI strain mapping is possible on biological tissues.

SUMMARY OF THE INVENTION

According to the teachings of the present invention, there is provided a method for depicting magnetic resonance characteristics of a wall of a hollow viscus, including the steps of acquiring a spatially resolved, double quantum filtered, nuclear magnetic resonance frequency spectrum from the wall of the hollow viscus, calculating a derived quantity describing a magnetic resonance parameter for the spectrum, the derived quantity being based on a parameter selected from the group consisting of a distribution of residual quadrupolar splitting and a distribution of residual dipolar splitting, and displaying the derived quantity as a graphic in at least two spatial dimensions.

There is further provided a method for depicting strain in a wall of a hollow viscus, including the steps of acquiring a spatially resolved, double quantum filtered, nuclear magnetic resonance frequency spectrum from a wall of the hollow viscus, calculating a derived quantity describing a magnetic resonance parameter for the spectrum, the derived quantity being based on a parameter selected from the group consisting of a distribution of residual quadrupolar splitting and a distribution of residual dipolar splitting, correlating the derived quantity with a value selected from the group consisting of a strain-to-quadrupolar-splitting value and a strain-to-dipolar-splitting value, and displaying the value as a graphic in at least two spatial dimensions.

There is also provided a method for depicting anatomy of a wall of a hollow viscus, including the steps of acquiring a spatially resolved, double quantum filtered, nuclear magnetic resonance frequency spectrum from the wall of the hollow viscus, selecting a point in the frequency domain of the spectrum, and displaying a value of the point as a graphic in at least two spatial dimensions.

There is further provided a method for depicting anatomy of a wall of a hollow viscus, including the steps of acquiring a spatially resolved, double quantum filtered, nuclear magnetic resonance free induction decay signal from the wall of the hollow viscus, selecting a point in a time domain representation of the free induction decay signal, and displaying a value of the point as a graphic in at least two spatial dimensions.

There is also provided a method for depicting a magnetic resonance characteristic of a tissue, including the steps of acquiring a spatially resolved, double quantum filtered, nuclear magnetic resonance frequency spectrum from the tissue, calculating a derived quantity describing a magnetic resonance parameter for the spectrum, the derived quantity being based on a parameter selected from the group consisting of a distribution of residual quadrupolar splitting and a distribution of residual dipolar splitting and displaying the derived quantity as a graphic in at least two spatial dimensions.

There is further provided a method for depicting strain in a tissue, including the steps of acquiring a spatially resolved, double quantum filtered, nuclear magnetic resonance frequency spectrum from the tissue, calculating a derived quantity describing a magnetic resonance parameter for the spectrum, the derived quantity being based on a parameter selected from the group consisting of a distribution of residual quadrupolar splitting and a distribution of residual dipolar splitting, correlating the derived quantity with a value selected from the group consisting of a strain-to-quadrupolar-splitting value and a strain-to-dipolar-splitting value, and displaying the value as a graphic in at least two spatial dimensions.

There is further provided a method for depicting tissue anatomy, including the steps of acquiring a spatially resolved, double quantum filtered, nuclear magnetic resonance frequency spectrum from the tissue, selecting a point in a frequency domain representation of the spectrum, and displaying a value of the point as a graphic in at least two spatial dimensions.

There is further provided a method for depicting tissue anatomy, including the steps of acquiring a spatial resolved, double quantum filtered, nuclear magnetic resonance free induction decay signal from the tissue, selecting a point in a time domain representation of the free indication decay signal, and displaying a value of the point as a graphic in at least two spatial dimensions.

The spatially resolved, double quantum filtered, nuclear magnetic resonance frequency spectrum acquired for the depiction of magnetic resonance characteristics, strain, or anatomy of a hollow viscus, or for the depiction of magnetic resonance characteristics, strain, or anatomy of a tissue, is derived from a free indication decay of either deuterium or hydrogen nuclei. The derived quantity describing a distribution of either the residual quadrupolar splitting or residual dipolar splitting is either an average residual quadrupolar splitting, average residual dipolar splitting, second moment of the distribution of quadrupolar splitting or second moment of the distribution of dipolar splitting.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The invention is herein described, by way of example only, with reference to the accompanying drawings, wherein.

DESCRIPTION OF THE PREFERRED EMBODIMENTS

Figure 1:
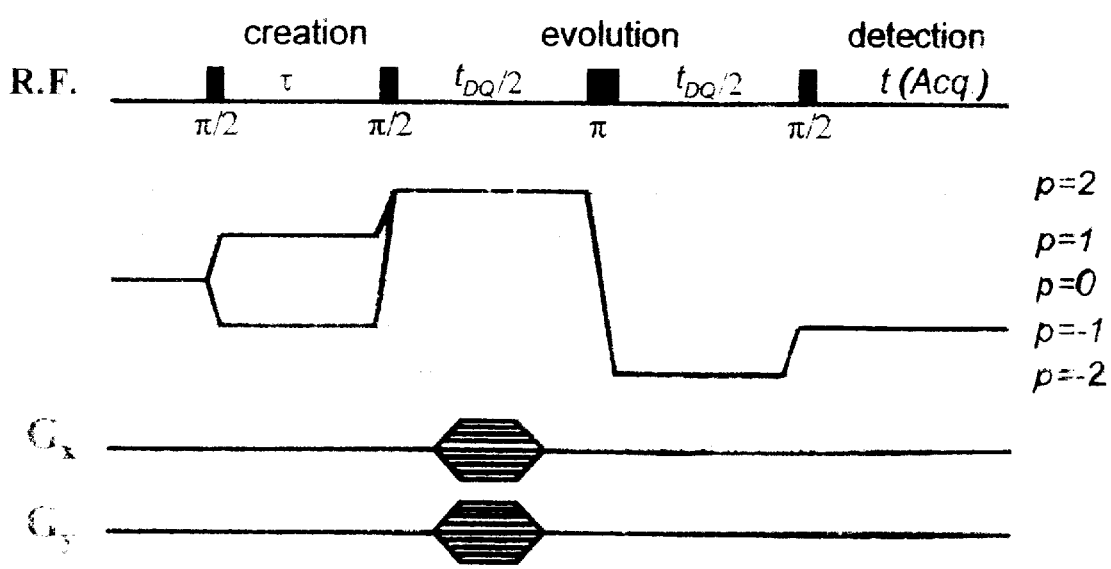
FIG. 1 is a magnetic resonance pulse sequence diagram.

The present invention is a method for 1) generating detailed two-dimensional images which depict all three histologic layers which constitute a blood vessel wall, 2) generating two-dimensional images which selectively depict each histologic layer, and 3) generating two-dimensional images which quantitatively map the degree of strain within a vessel wall.

In the preferred embodiment, the method entails acquiring a spatially encoded DQF MR signal from the tissue, using deuterated water as a "spy" molecule. In an alternative embodiment, a new method of DQF MR spectroscopy, based on the direct imaging of $^1$H nuclei in the tissue, without the need for external "spy" molecules, if used.

This latter method is based on the principle that the formation of a double quantum coherency, in addition to occurring in association with the energy transitions of quadrupolar nuclei, also results from the interaction of two dipoles ($^1$H), each of spin=½. The state of two such interacting dipolar nuclei is analogous to a single quadrupolar nucleus of spin=1. In the case of anisotropic movement of the nuclei, a "non-vanishing residual dipolar interaction" ensues, in a manner analogous to that previously described for quadrupolar nuclei. This non-vanishing residual dipolar interaction can be investigated in an identical manner to that described for non-vanishing residual quadrupolar interactions, and provides identical information regarding the state of anisotropy of the tissue under study. The main interaction contributing to the $^1$H DQF signal is an intermolecular interaction between the water protons and species whose protons do not exchange with water. These species can be assigned to the oriented macromolecular structure, which is mainly collagen fibers. The validity of $^1$H DQF has been established by Tsoref, Shinar and Navon (L. Tsoref, H. Shinar, and G. Navon, "Observation of a $^1$H Double Quantum Filtered Signal of Water in Biological Tissues," submitted to *Magnetic Resonance in Medicine*. L. Tsoref, H.

Shinar and G. Navon, "Detection of Anisotropy in Biological Tissues by Double Quantum Filtered $^1$H NMR Spectroscopy," in "*Proc. ISMRM. 5th Annual Meting*", Vancouver, 1997, p. 246. L. Tsoref, H. Shinar and G. Navon, "Observation of $^1$H Double Quantum Filtered Signal of Water and Lipids in Biological Tissues," in "*7th Chianti Workshop on Magnetic Resonance Nuclear and Electron Relaxation,*" San Miniato, Italy, 1997, p. 139) which are incorporated herein by reference. The principle that $^1$H DQF magnetic resonance can depict tissue anisotropy is in accordance with several works that demonstrate that there is a significant interaction between water molecules and macromolecules that affect relaxation times such as $T_1$ and $T_2$ (H. T. Edzes and E. T. Samulski, "Cross Relaxation and Spin Diffusion in the Proton NMR of Hydrated Collagen," *Nature*. 1977; 265:521–523. B. M. Fung and T. W. McGaughy, "Cross Relaxation in Hydrated Collagen," *J.Magn.Reson*. 1980;39:413–420.). An advantage of using $^1$H nuclei for the NMR investigation of anisotropy, as opposed to quadrupolar nuclei such as $^2$H, is that due to the natural abundance of $^1$H nuclei, biological tissues can be investigated in their natural state, without having to chemically manipulate the tissue by exposing it to deuterium.

The principles and operation of the method for imaging the strain and histology of a blood vessel wall may be better understood with reference to the drawings and the accompanying description.

FIG. 1 is a magnetic resonance pulse sequence diagram describing an imaging protocol which first creates, then allows for the evolution of, and then detects the presence of double quantum coherences. In the diagram $\pi$ is the pulse length such that $\pi$ represents 180° and $\pi/2$ represents 90°. $G_x$ and $G_y$ represent the magnetic gradients in the x and y axes, $t_{DQ}$=double quantum coherence time, and p=coherence (p=2 indicating a double quantum coherence state). Prior to the measurements the tissue to be imaged is exposed to $D_2O$ either by local injection (if an in-vivo tissue is being imaged) or by immersion for at least 2 hours at 4° C. in 150 mM NaCl in $D_2O$ (if an explained tissue is being studied). The MRI imaging is conducted on a standard magnetic resonance spectrometer such as a 300 MHz AMX-WB Bruker NMR spectrometer equipped with a 200G/cm gradient unit and an imaging probe tuned for deuterium frequency (46.05 MHz). The imaging protocol and hardware used to acquire $^1$H DQF spectra are identical to that described above, with the exception that the imaging probe is tuned to 300 MHz. The DQF spectroscopic imaging method consists of a sequence of three non-selective RF excitations, where spatial information is obtained by employing magnetic field gradients in the x and y axes during the evolution of double quantum coherences, so as to spatially localize the DQF FID signals. The phase accumulated during the application of the magnetic field gradients is $\exp[i\Delta p(\Delta t y G)\cdot r]$, where $\Delta p(=2)$ is the change in coherence, G is the strength of the magnetic field gradients, y is the gyromagnetic factor, $\Delta t$ stands for the duration of applied gradients and r is the spatial position vector. Thus, for each acquired voxel, a spectrally complete FID signal is obtained.

In a preferred embodiment, at least one point (by which is meant an individual frequency value or an individual time value within an FID data set) in the frequency domain representation of the FID is selected for all the acquired voxels. In a further embodiment the point selected lies in the time domain representation of the FID data set. An array consisting of the resultant point derived quantities (either of frequency domain or time domain) and corresponding spatial localization data for each voxel is then read into a standard computer graphics program, such as Adobe Photoshop, running on a standard computer such as an IBM compatible PC with a 75 mHz processor and 16 megabytes of RAM. By running the software, a color-coded, quantitative two dimensional map depicting tissue histology is generated.

Figure 2:
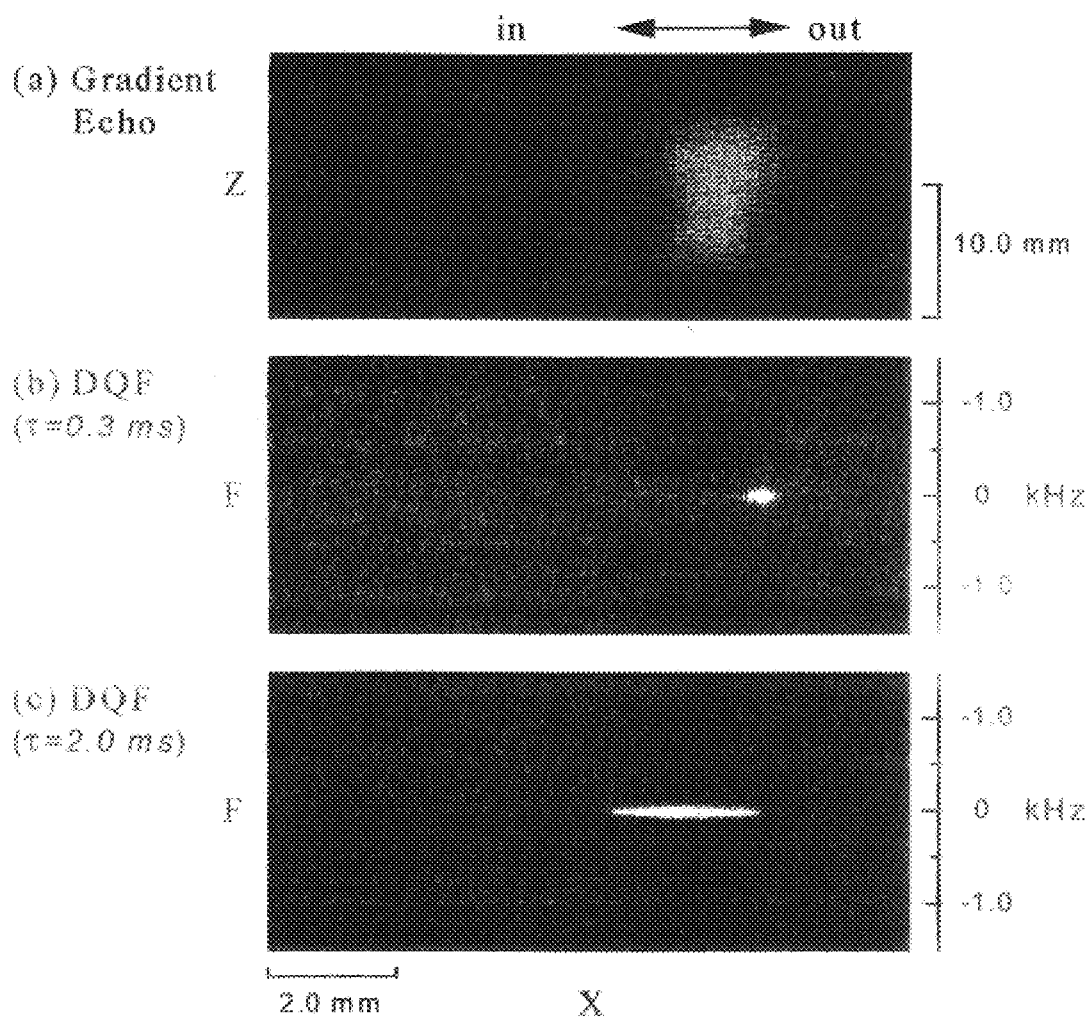
FIG. 2 is a $^2$H gradient echo image and 1 dimensional spectroscopic images of a strip of bovine aorta.

For purposes of illustration of the process of generating a 2D histological map, a 1 dimensional map (i.e. with frequency (F) data from the frequency domain of the FID being depicted on the y axis and a unidimensional distance along the x axis) along with a corresponding 2D $^2$H gradient echo image of a strip of bovine aorta is depicted in FIG. 2. A strip cut of bovine aorta was initially immersed in $D_2O$ prior to being placed in the NMR tube. FIG. 2(*a*) shows a conventional 2D $^2$H gradient echo image. The pixel intensity is proportional to the total water content, and therefore reflects mostly water in bulk. FIGS. 2(*b*) and 2(*c*) show the corresponding $^2$H 1D DQF spectroscopic (X-F) images acquired for a relatively short $\tau$ (creation time) value (0.3 ms) and for a longer $\tau$ value (2.0 ms. The images reveal two distinct tissue layers. For a relatively short creation time ($\tau$=0.3 ms) all tissue layers contribute to the center of the spectrum, whereas the off-center frequency signals ($\Delta v/>100$ Hz) display bound water, with a large residual quadrupolar interaction, only in the outer layer. For a longer creation time ($\tau$=2.0 ms) the intensity of water in the inner layer increases while the signal of water in the outer layer has already decayed. Therefore the center frequency segment represents only the narrow signal of water in the inner layer (practically the tunica media). Both spectroscopic images were acquired with pixel resolution of 0.08 mm and 10 Hz for the X and F dimensions respectively.

Figure 3:
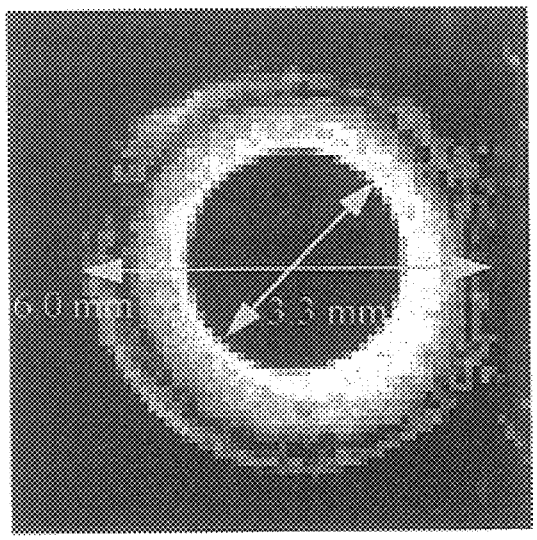
FIG. 3 is a series of $^2$H DQF 2 dimensional histological images of a cross section of $D_2O$-hydrated bovine coronary artery.
Figure 3:
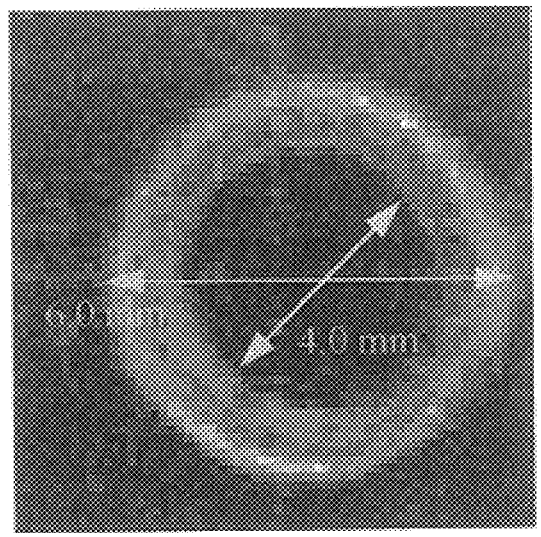
Figure 3:
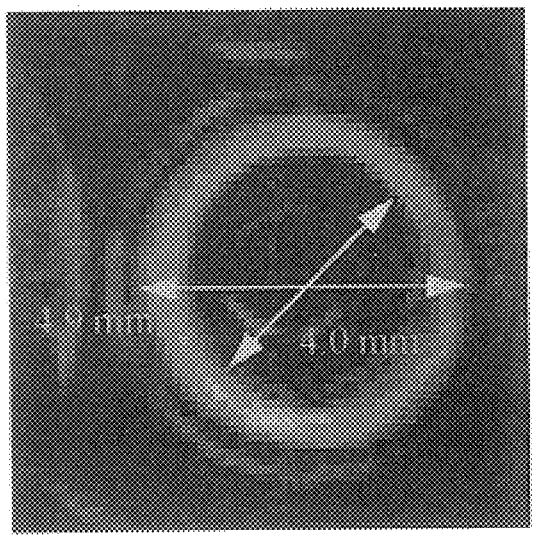
Figure 3:
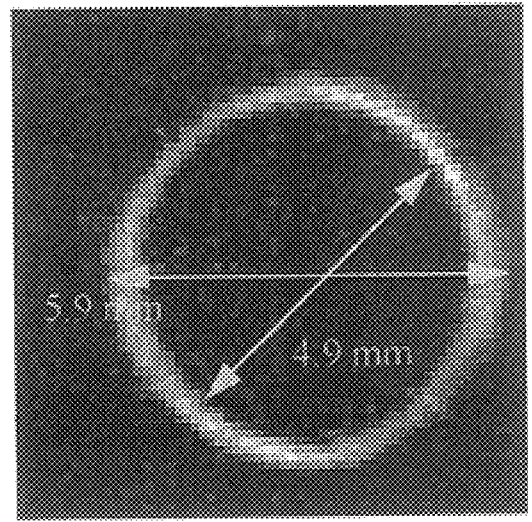

The vessel wall properties illustrated in FIG. 2 can be appreciated in 2 spatial dimensions in the $^2$H DQF 2D histological images of a cross section of $D_2O$-hydrated bovine coronary artery shown in FIG. 3. As it is known that each histological a layer of a blood vessel wall contains a different amount of collagen as part of its protein skeleton, the degree of tissue anisotropy serves to contrast the different tissue layers in the histology map. The sample is mounted on a stabilizing stick inside the NMR tube, positioned parallel to the magnetic field. In FIG. 3(*a*) a conventional gradient echo image is shown, demonstrating mostly the free water accumulated between the tissue and the stabilizing stick (3.3 mm in diameter) and water on the outer edge of the vessel. FIGS. 3(*b*) to 3(*d*) illustrate 2D $^2$DQF images constructed for slices 100 Hz wide in the frequency dimension. In FIG. 3(*b*) the image was acquired using a short creation time ($\tau$=0.3 ms) and is located at the center of the spectrum. It thus displays bound water in all layers of the vessel wall. FIG. 3(*c*) shows an image acquired using a longer creation time ($\tau$=2.0 ms). Only bound water in the inner layer is shown. FIG. 3(*d*) shows an image acquired with a short creation time ($\tau$=0.3 ms), but located 300 Hz off-center. It displays bound water in the outer layer only. The lumen of the vessel is 12.3±0.3 mm$^2$ and the thickness of the inner and the outer layers are 0.9 mm and 1.0 mm, respectively. A comparison between the conventional gradient echo image (FIG. 3*a*) and the DQF images (FIGS. 3*b*–3*d*) clearly demonstrates the suppression of the free water signal. Furthermore, the ability of the method to selectively display each of the tissue layers or both, allows for convenient measurement of the luminal area, and the thickness of each individual layer.

Thus, by modifying the creation time ($\tau$) of the imaging sequence, and by selecting different points on the frequency or time domains of the FID for display, different tissue layers are selectively imaged. In an analogous manner, the second pulse length ($\tau/2$) can be varied so as to optimize image contrast. As such, by appropriate selection of the above parameters, the histological map of a tissue can be optimized to best display the tissue strata, in accordance with the specific characteristics of each individual tissue being imaged.

In the preferred embodiments of a method for imaging tissue strain, a derived quantity describing a distribution of residual quadrupolar or dipolar splitting is calculated from the FID signal. In one preferred embodiment this derived quantity is the average residual quadrupolar (or dipolar) splitting. In an alternative embodiment, this derived quantity is the second moment of the distribution of quadrupolar (or dipolar) splitting.

The theoretical background behind, and method for calculating, the average residual quadrupolar splitting will now be detailed. The procedure for calculating the average residual dipolar splitting is analogous.

The deuterium DQF NMR spectrum of blood vessels immersed in $D_2O$ represents the sum of spectra from many anisotropic compartments. Each compartment can be effectively characterized by a local residual quadrupolar interaction, $\omega_q$, an orientation of the local symmetry axis relative to the external field, $\theta$, and a transverse relaxation rate $R_2$. The angular dependency of the observed residual quadrupolar interaction $\omega_{q,\theta}$ is given by $$\omega_{q,\theta} = \omega_q \tfrac{1}{2}(3\cos^2\theta - 1). \qquad [1]$$

It is convenient to define $P_q(\omega_{q,\theta})$ as the probability density function of finding an anisotropic site with $\omega_{q,\theta}$. $P_q(\omega_{q,\theta})$ is a non-negative function ($P_q(\omega_{q,\theta}) \geq 0$) and $$\int_{-\infty}^{\infty} P_q(\omega_{q,\theta}) d\omega_{q,\theta} = 1.$$

The DQF free induction decay (FID) signal is given by (Sharf et al., 1995)

$$FID(\tau, t) = M_0 \int_{-\infty}^{\infty} P_q(\omega_{q,\theta}) \sin(\omega_{q,\theta}\tau) \sin(\omega_{q,\theta}t) \exp[-R_2(\tau+t)] d\omega_{q,\theta}$$

where $M_0$ is the total magnetization at thermal equilibrium arising from all anisotropic sites. In the derivation of the last expression it is assumed that $R_2$ is constant and that $\omega_{q,\theta} > R_2$ throughout the sample. One may note that this assumption does not hold for local directors pointing near the magic angle of $\theta_c = 54.7°$, where according to Eq. [1] $\omega_{q,\theta}$ vanishes. However, as blood vessel walls exhibit a board distribution of local directors the relative signal intensities of those local directors near the magnetic angle are relatively small, and may therefore be neglected.

If a creation time $\tau = \tau_0$ is selected to satisfy the condition that $\max^*(|\omega_{q,\theta}\tau_v|) << \pi/2$, the integration of the FID over the acquisition time t, is in the first order approximation independent of $\omega_q$ and equals to $$I_{FID} = \int_0^{\infty} FID(\tau_0, t) dt \approx \tau_0 M_0. \qquad [3]$$

Equivalently $I_{FID}$ is given by the intensity of magnitude calculation at the center of the spectrum.

The DQF spectrum, $S(\omega)$, is the Fourier transform of the FID signal with respect to t. Following the above assumptions i.e. $\max(|\omega_{q,\theta}\tau_0|) << \pi/2$ and $|\omega_{q,\theta}| >> R$. Its imaginary part is given in first order approximation by $$\text{Im}\{S(\omega)\} = \frac{-\pi}{2} M_0 \int_{-\infty}^{\infty} P_q(\omega_{q,\theta}) \omega_{q,\theta}\tau_0 [\delta(\omega - \omega_{q,\theta}) - \delta(\omega + \omega_{q,\theta})] d\omega_{q,\theta} \qquad [4]$$

$$= \frac{-\pi}{2} \omega \tau_0 M_0 [P_q(\omega) + P_q(-\omega)]$$

Considering the odd parity of $\text{IM}[S(\omega)]$ in respect to $\omega$ it is clear that $$\int_{-\infty}^{\infty} IM[S(\omega)] d\omega = 0,$$

as expected for the DQF spectrum. However the integral $$I_s \equiv \frac{2}{\pi} \int_{-\infty}^{\infty} \text{sign}(\omega) \text{Im}[S(\omega)] d\omega,$$

where $\text{sign}(\omega)$ equals 1 for $\omega \geq 0$ and $-1 \omega < 0$, yields a non=zero value. The last integral can be calculated according to, $$I_s = -\tau_0 M_0 \int_{-\infty}^{\infty} \text{sign}(\omega)\omega[P_q(\omega) + P_q(-\omega)] d\omega$$

$$= -2\tau_0 M_0 \int_{-\infty}^{\infty} |\omega| P_q(\omega) d\omega.$$

$I_S$ weights the distribution density function by the absolute offset frequency and therefore the ratio $-I_S/I_{FID}$ can be considered as a measure for the average residual quadrupolar splitting $<\Delta v_q>$.

The theoretical background behind, and method for calculating, the second moment of the distribution of quadrupolar splitting will now be detailed. The process for calculating the second moment of the distribution of dipolar splitting is analogous.

Following the assumptions that were used for calculating the total magnetization and the first moment, i.e. $\max(|\omega_{q,\theta}\tau_0|) << \pi/2$ and $|\omega_{q,\theta}| >> R$, the DQF spectrum, $S(\omega)$, is in the first order approximation given by $$S(\omega) = \frac{-i\pi}{2} M_0 \int_{-\infty}^{\infty} P_q(\omega_{q,\theta}) \omega_{q,\theta}\tau_0 [\delta(\omega - \omega_{q,\theta}) - \delta(\omega + \omega_{q,\theta})] d\omega_{q,\theta} \qquad [6]$$

$$= \frac{-i\pi}{2} \omega \tau_0 M_0 [P_q(\omega) + P_q(-\omega)]$$

The DQF spectrum is imaginary because we have neglected the relaxation. Considering the odd parity of $S(\omega)$ in respect to $\omega$ it is clear that $$\int_{-\infty}^{\infty} S(\omega) d\omega = 0,$$

as expected for the DQF spectrum. The first moment $M_1^S$, of the imaginary part of the DQF spectrum is given by $$M_1^S \equiv \int_{-\infty}^{\infty} \omega \operatorname{Im}[S(\omega)] d\omega \quad [7]$$

$$= -\frac{\pi}{2}\tau_0 M_0 \int_{-\infty}^{\infty} \omega^2 [P_q(\omega) + P_q(-\omega)] d\omega$$

$$= -\pi\tau_0 M_0 \int_{-\infty}^{\infty} \omega^2 P_q(\omega) d\omega$$

$$= -\pi\tau_0 M_0 M_2(P_q)$$

The notation $M_2(P_q)$ stands for the second moment of the distribution density function $P_q(\omega_{q,\theta})$ and is defined by $$M_2(P_q) \equiv \int_{-\infty}^{\infty} \omega^2 P_q(\omega) d\omega. \quad [8]$$

Thus, the first moment of the DQF spectrum has an explicit physical meaning—it is proportional to second moment of the distribution density function $P_q(\omega_{q,\theta})$. The normalization factor $\tau_0 M_0$ can be determined easily either by integrating the FID or directly from the magnitude calculation at zero frequency $|S(0)|$.

Figure 4:
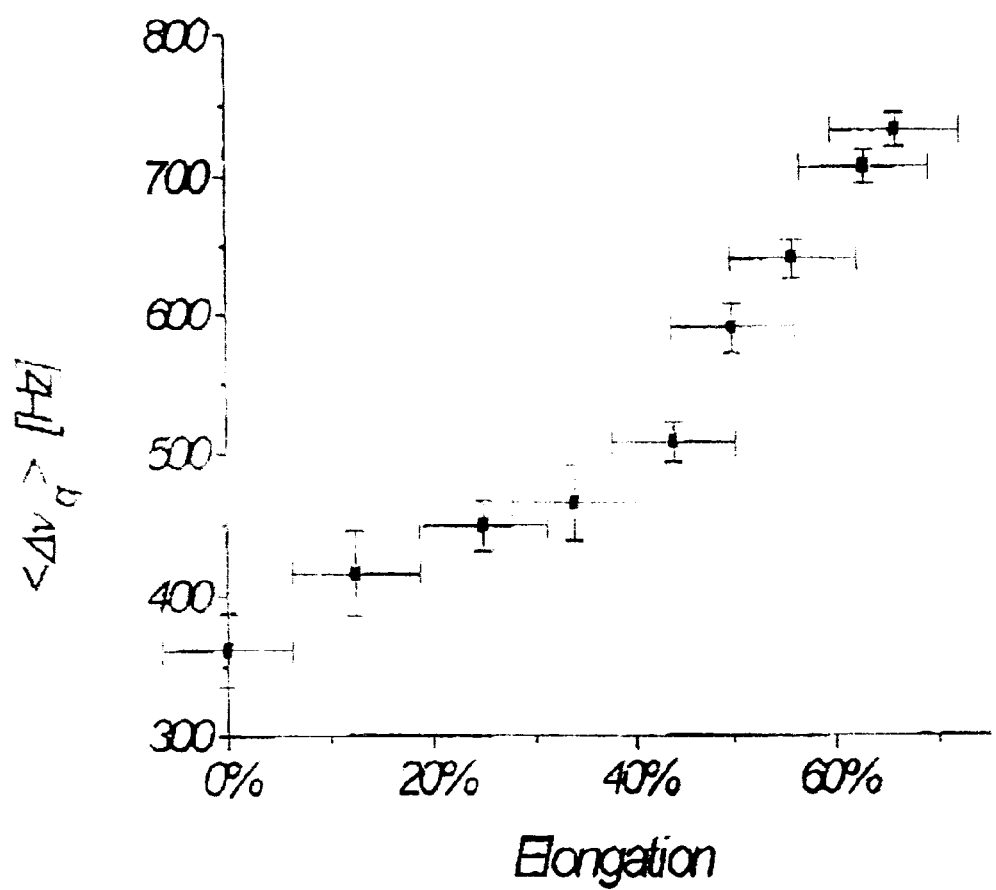
FIG. 4 is a graph describing describing a correlation between tissue strain and a residual quadrupole splitting value.

Once the derived quantity describing a distribution of residual quadrupolar or dipolar splitting has been calculated (according to one of the above methods) it is then correlated with a value describing tissue strain, henceforth also referred to as a strain-to-quadrupolar-splitting value, or a strain-to-dipolar-splitting value, by employing a known formula describing a correlation between tissue strain and a distribution of a residual quadrupolar splitting value or a residual dipolar splitting value. In a preferred embodiment, the formula used for this calculation is the graph depicted in FIG. 4, which is based on that reported by Sharf, Axelrod and Navon (Y. Sharf, S. Akselrod, G. Navon, "Measurement of strain exerted on blood vessel walls by double-quantum-filtered $^2$H NMR." *Magnetic Resonance in Medicine.* 1997; 37:69–75) for bovine coronary artery tissue. In an alternative embodiment, a new formula correlating strain with residual quadrupole splitting for the specific tissue being examined is calculated on a specimen of the tissue according to the method described by Sharf, Axelrod and Navon (Y. Sharf, S. Akselrod, G. Navon, "Measurement of strain exerted on blood vessel walls by double-quantum-filtered $^2$H NMR." *Magnetic Resonance in Medicine.* 1997; 37:69–75), which is incorporated herein by reference.

Figure 5:
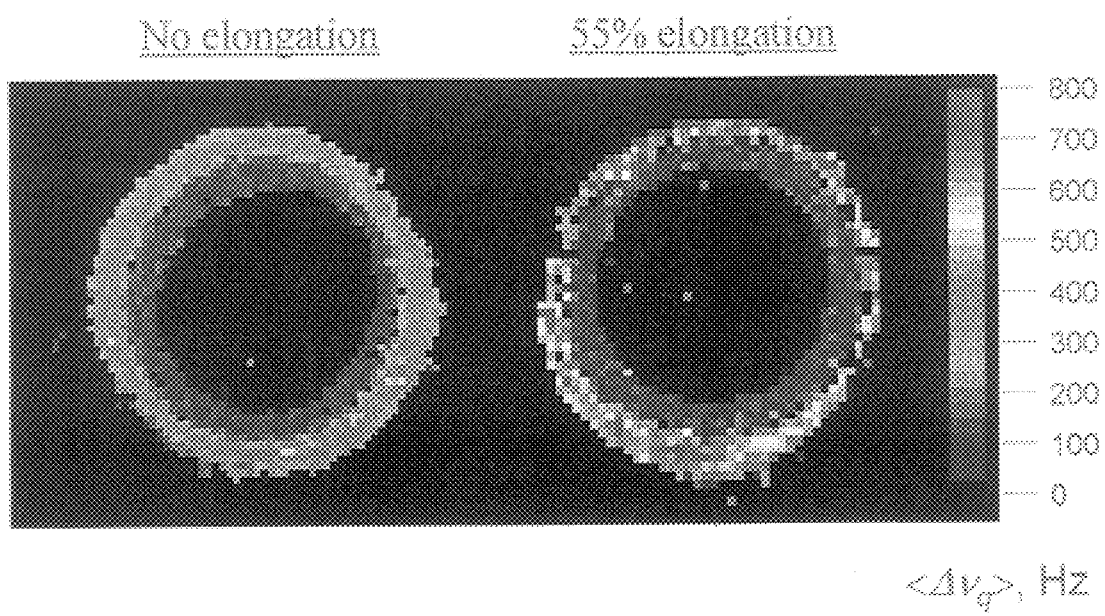
FIG. 5 is a 2 dimensional map of the average $^2$H quadrupolar splitting, $<\Delta v_q>$, of a bovine coronary artery in unstressed and elongated states.

An array comprising the strain-to-quadrupolar-splitting values (or the strain-to-dipolar-splitting values) and the corresponding spatial localization data for each voxel is then read into a standard computer such as Adobe Photoshop, running on a standard computer such as an IBM compatible PC with a 75 mHz processor and 16 megabytes of RAM. By running the software, a color-coded, quantitative two dimensional map depicting a distribution of residual quadrupolar, or dipolar, splitting is generated. FIG. 5 illustrates two such maps. The two images display 2D maps of the average $^2$H quadrupolar splitting, $<\Delta v_q>$, of a bovine coronary artery, unstressed (left) and 55% elongated (right). In the magnet the artery, originally equilibrated in $D_2O$, was aligned with the external magnetic field. $<\Delta v_q>$ was calculated using 256 spectral points for each of the (64×64) pixels of the $^2$H DQF spectroscopic data sets. The left image was acquired using TR (repetition time)=1 s, τ(creation time)=0.3 ms. To optimize the signal to noise ratio for both tissue layers, the right image was calculated by combining two sets of data; for the outer layer, data were acquired using TR=0.1 s and τ=0.3 ms, and for the inner layer, data were acquired using TR-0.1 s, τ=2.0 ms. The field of view of both images was 0.75 cm. The color scale corresponds to $<\Delta v_q>$ ranging from 0 to 800 Hz. The bluish colors in both images demonstrate the relatively narrow spectrum of the tunica media, which is insensitive to strain. In the left image the cyan-greenish colors that dominate the outer layer, the tunica adventitia, correspond to $<\Delta v_q>$ values of 350–450 Hz for the unstressed vessel. In the right image the yellow—red colors reflect larger values of residual quadrupolar interaction ($<\Delta v_q>$ ranges between 550 and 800 Hz) associated with regions with higher strain. The outer layer of the stretched sample exhibits a variety of red and yellow colors. As the greyscale reproductions shown in FIG. 5 do not convey the color contrast adequately, the areas of different color have been appropriately labeled.

In an analogous manner to that describe above for the generation of a map depicting the average residual quadrupolar, or dipolar, splitting, a 2 dimensional map depicting the second moment of the distribution of quadrupolar or dipolar splitting can be generated.

It will be appreciated that by depicting either the strain-to-quadrupolar-splitting value, or the strain-to-dipolar-splitting value (instead of the value for residual quadrupolar splitting), for each voxel in a similar manner to that shown in FIG. 5, a two dimensional quantitative strain map is obtained.

Although the above method has been described for the depiction of blood vessel wall histology and strain, it will be appreciated that any biological tissue can be studied in a similar manner.

What is claimed is:

1. A method for depicting strain in a wall of a hollow viscus, comprising
   (a) acquiring a spatially resolved, double quantum filtered, nuclear magnetic resonance frequency spectrum from water molecules in the wall of the hollow viscus
   (b) calculating a derived quantity describing a magnetic resonance parameter for said spectrum, said derived quantity being based on a parameter selected from the group consisting of a distribution of residual quadrupolar splitting and a distribution of residual dipolar splitting
   (c) correlating said derived quantity with a value selected from the group consisting of a strain-to-quadrupolar-splitting value and a strain-to-dipolar-splitting value, and
   (d) displaying said value as a graphic in at least two spatial dimensions.

2. The method of claim 1, wherein said spectrum is derived from a free induction decay of an atomic nucleus selected from the group consisting of deuterium and hydrogen nuclei.

3. The method of claim 1, wherein said derived quantity is selected from the group consisting of average residual quadrupolar splitting, average residual dipolar splitting, second moment of the distribution of quadrupolar splitting and second moment of the distribution of dipolar splitting.

4. A method for depicting anatomy of a wall of a hollow viscus, comprising:
   (a) acquiring a spatially resolved, double quantum filtered, nuclear magnetic resonance frequency spectrum from water molecules in the wall of the hollow viscus
   (b) selecting a point in the frequency domain of said spectrum, and
   (c) displaying a value of said point as a graphic in at least two spatial dimensions.

5. The method of claim 4, wherein the signal is derived from a free induction decay of an atomic nucleus selected from the group consisting of deuterium and hydrogen nuclei.

6. A method for depicting anatomy of a wall of a hollow viscus, comprising:
   (a) acquiring a spatially resolved, double quantum filtered, nuclear magnetic resonance free induction decay signal from water molecules in the wall of the hollow viscus
   (b) selecting a point in a time domain representation of said free induction decay signal, and
   (c) displaying a value of said point as a graphic in at least two spatial dimensions.

7. The method of claim 6, wherein said signal is derived from a free induction decay of an atomic nucleus selected from the group consisting of deuterium and hydrogen nuclei.

8. A method for depicting strain in a tissue, comprising:
   (a) acquiring a spatially resolved, double quantum filtered, nuclear magnetic resonance frequency spectrum from water molecules in the tissue
   (b) calculating a derived quantity describing a magnetic resonance parameter for said spectrum, said derived quantity being based on a parameter selected from the group consisting of a distribution of residual quadrupolar splitting and a distribution of residual dipolar splitting
   (c) correlating said derived quantity with a value selected from the group consisting of a strain-to-quadrupolar-splitting value and a strain-to-dipolar-splitting value, and
   (d) displaying said value as a graphic in at least two spatial dimensions.

9. The method of claim 8, wherein the frequency spectrum is derived from a free induction decay of an atomic nucleus selected from the group consisting of deuterium and hydrogen nuclei.

10. The method of claim 8, wherein said derived quantity is selected from the group consisting of average residual quadrupolar splitting, average residual dipolar splitting, second moment of the distribution of quadrupolar splitting and second moment of the distribution of dipolar splitting.

11. A method for depicting tissue anatomy, comprising:
    (a) acquiring a spatially resolved, double quantum filtered, nuclear magnetic resonance frequency spectrum from water molecules in the tissue
    (b) selecting a point in a frequency domain representation of said spectrum, and
    (c) displaying a value of said point as a graphic in at least two spatial dimensions.

12. The method of claim 11, wherein said frequency spectrum is derived from a free induction decay of an atomic nucleus selected from the group consisting of deuterium and hydrogen nuclei.

13. A method for depicting tissue anatomy, comprising
    (a) acquiring a spatially resolved, double quantum filtered, nuclear magnetic resonance free induction decay signal from water molecules in the tissue
    (b) selecting a point in a time domain representation of said free induction decay signal, and
    (c) displaying a value of said point as a graphic in at least two spatial dimensions.

14. The method of claim 13, wherein said signal is derived from a free induction decay of an atomic nucleus selected from the group consisting of deuterium and hydrogen nuclei.

* * * * *